(12) United States Patent
Nakamura

(10) Patent No.: US 6,285,577 B1
(45) Date of Patent: Sep. 4, 2001

(54) NON-VOLATILE MEMORY USING FERROELECTRIC CAPACITOR

(75) Inventor: Takashi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/671,599

(22) Filed: Sep. 28, 2000

(30) Foreign Application Priority Data

Sep. 30, 1999 (JP) .................................................. 11-280237

(51) Int. Cl.[7] .................................................. G11C 11/22
(52) U.S. Cl. .................................................. 365/145; 365/65
(58) Field of Search ..................................... 365/145–149, 365/65, 185.01; 257/295, 298, 300

(56) References Cited

U.S. PATENT DOCUMENTS 5,559,733 * 9/1996 McMillan .............................. 365/145
5,877,977 * 3/1999 Essaian ................................. 365/145
5,886,920 * 3/1999 Marshall .............................. 365/145

* cited by examiner

*Primary Examiner*—A. Zarabian
(74) *Attorney, Agent, or Firm*—Morgan, Lewis & Bockius LLP

(57) ABSTRACT

A non-volatile memory includes a ferroelectric transistor with a gate electrode stacked through at least a first ferroelectric film on the surface of a semiconductor substrate between source/drain regions, and a ferroelectric capacitor that includes first and second electrodes, and a second ferroelectric layer sandwiched between the electrodes. The first electrode is connected to one of the source/drain regions and has a first potential difference generated between the electrode and the semiconductor substrate to invert polarization of the first ferroelectric layer, and a second potential difference generated between the first and the second electrode to invert polarization of the second ferroelectric layer so that write and read of data are executed.

11 Claims, 4 Drawing Sheets

FIG. 3
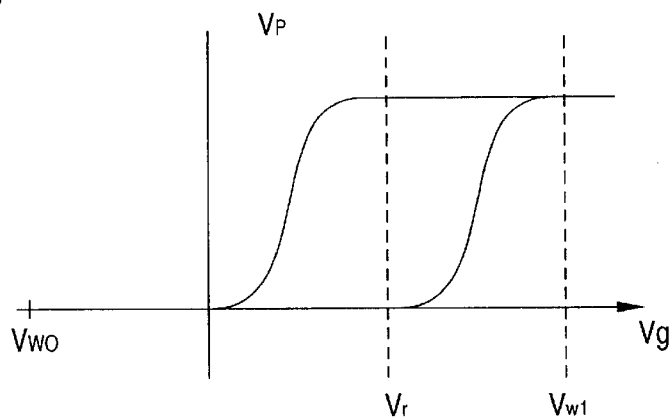
FIG. 4A
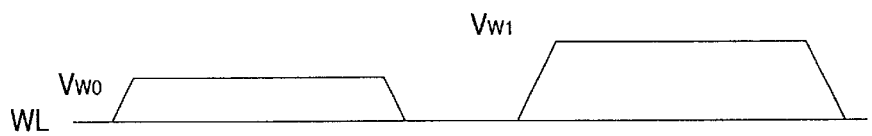
FIG. 4B
FIG. 4C
FIG. 4D
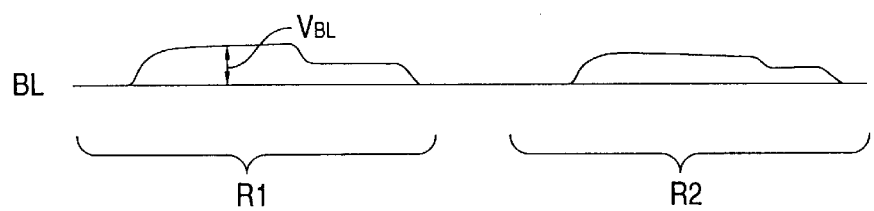
FIG. 5
| $C_{FE}$ | $C_F$ | R1 | R2 |
|---|---|---|---|
| 0 | 0 | 0 | N |
| 0 | 0 | 0 | P |
| 1 | 0 | N | N |
| 1 | 1 | P | N |

TYPE-FET

*(PRIOR ART) (PRIOR ART) (PRIOR ART)*

TYPE-ITIC

NON-VOLATILE MEMORY USING FERROELECTRIC CAPACITOR

BACKGROUND OF THE INVENTION

1. Field of the Invention

The present invention relates to a non-volatile memory, and more particularly to a composite non-volatile memory including a ferroelectric capacitor and an MFS (metal-ferroelectric-semiconductor) field effect transistor, MFIS (metal-ferroelectric-insulator-semiconductor) field effect transistor or MFMIS (metal-ferroelectric-insulator-semiconductor) field effect transistor.

2. Description of the Related Art

The ferroelectric memory which is being researched nowadays is roughly classified into two systems. The one is a memory of a system in which the quantity of inverted charges of a ferroelectric capacitor is detected. This system includes a ferroelectric capacitor and a select transistor.

The other is a memory of the system in which a change in the resistance of semiconductor due to spontaneous polarization of ferroelectric is detected. A representative system thereof is an MFSFET. This MFSFET has a MIS structure using ferroelectric for a gate insulating film. In this structure, a ferroelectric layer must be directly formed on a semiconductor surface so that it is difficult to control the interface between the ferroelectric and semiconductor (ferroelectric/semiconductor interface). Therefore, it has been said that it is difficult to manufacture a good memory using this MFSFET. For this reason, at present, the main tendency is the memory structure in which a buffer layer is formed on the ferroelectric/semiconductor interface. However, we have proposed an FET of a MFMIS structure, as seen from an equivalent circuit diagram of FIG. 6 and a sectional view of FIG. 7, in which a buffer layer composed of a metallic layer (M) and an insulating layer (I) is formed on the ferroelectric/semiconductor interface. This FET having MFMIS structure has a gate oxide film 5, floating gate 6, ferroelectric film 7 and control gate 8 which are successively stacked on a channel region formed between source/drain regions 2 and 3 of a semiconductor substrate 1.

In this configuration, when a positive voltage is applied to the control gate 8 over the substrate 1, the ferroelectric film 7 generates inverted polarization. Even when the application of the voltage to the control gate 8 is ceased, a negative charge is generated on the channel region CH owing to the residual polarization of the ferroelectric film 7. This state is referred to as the state of "1".

Reverse to the above case, when a negative voltage is applied to the control gate 8, the ferroelectric film 8 generates the inverted polarization in an opposite direction that in the above case. Even when the application of the voltage to the control gate 8, a positive charge is generated to the channel region CH owing to the residual polarization of the ferroelectric film 7. This state is referred to as the state of "0". In this way, the information of "1" or "0" can be written in the FET.

The read of the written information is executed by applying a read voltage $V_r$ to the control gate 8. The read voltage $V_r$ is prescribed between the threshold value $V_{th1}$ in the state of "1" and the threshold value $V_{th0}$ in the state of "0". It can be decided whether the written information is "1" or "0" by detecting whether or not the drain current has flowed when the read voltage Vr is applied to the control gate 8.

In this way, the FET of the MIS structure permits a single memory cell to be formed by a single element so that non-destructive read can be made satisfactorily. The former ferroelectric memory including a select transistor and a ferroelectric capacitor, as seen from an equivalent circuit diagram of FIG. 8 and a sectional view of FIG. 9, can hold charges of two values of "0" and "1" in a single ferroelectric capacitor. For example, as understood from the hysteresis characteristic as shown in FIG. 10, where the storage information of "0" is written, with the voltage applied to the capacitor being minus (with a select transistor $T_{SW}$ being on, a minus potential is applied to a bit line BL and a plus potential is applied to a plate line PL) after having passed point d, the applied voltage is restored to zero. In this case, the polarized value results in a residual polarized point a so that the storage information of "0" can be written. On the other hand, where storage information of "1" is written, with the voltage applied to the capacitor being plus, after having passed point b, the applied voltage is restored to zero. In this case, the polarized value results in a residual polarized point c so that the storage information of "1" can be written.

The read of data can be carried out in such a manner that the quantity of charges flowing into the bit line when the voltage is applied to the capacitor is detected.

The charges flowing from the ferroelectric capacitor into the bit line changes the potential on the bit line. The bit line has a parasitic bit line capacitance Cb generated because of the presence of the bit line itself. When the select transistor is turned on to select the memory to be read, according to the information stored in each selected memory cell, the charge is outputted onto the bit line. The value obtained when this charge is divided by the entire capacitance of the bit line represents the potential on the bit line.

A difference between the bit line potentials is read in comparison with a predetermined reference potential.

SUMMARY OF THE INVENTION

These memory structures can only execute the write or read of binary information. In order to obviate such inconvenience, an object of the present is to provide a memory structure which can execute the write and read of multilevel information.

In order to attain the above object, in accordance with the invention, there is provided a non-volatile memory comprising:

a ferroelectric transistor including a gate electrode stacked through at least a first ferroelectric layer on the surface of a semiconductor substrate between source/drain regions formed therein; and a ferroelectric capacitor including a first and a second electrode and a second ferroelectric layer sandwiched between the first and the second electrode, the first electrode being connected to one of the source/drain regions, characterized in that a first potential difference is generated between the gate electrode and the semiconductor substrate to invert the polarization of the first ferroelectric layer, and a second potential difference is generated between the first and the second electrode to invert the polarization of the second ferroelectric layer so that write and read of data of multilevel values are executed.

Preferably the ferroelectric transistor is a transistor of an MFIS structure which is provided with the gate electrode formed through the first ferroelectric layer and a gate insulating film on the surface of the semiconductor substrate between source/drain regions formed therein.

Preferably, the ferroelectric transistor is a transistor of an MFIS structure having a floating gate, the first ferroelectric layer and a control gate stacked through a gate insulating film on the surface of the semiconductor substrate between source/drain regions formed therein.

In this configuration, by combining a voltage applied between the substrate and a gate (word line) such as a control gate and the value of a drain current (channel resistance) under a gate potential of the ferroelectric transistor, the write and read of data of multilevel values can be made very easily.

Prefarably, the first and the second ferroelectric layer are a ferroelectric layer formed in the same step.

In this configuration, in addition to the above effect, a non-volatile memory which can be easily manufactured and a simple structure and great reliability.

Incidentally, where the first and the second ferroelectric layer are formed in the same step, the memory composed of a single transistor and a single capacitor is preferably made of PZT or SBT, but not preferably made of STN.

On the other hand, where the first and the second ferroelectric layer are formed in the same step, the memory cell is composed of a single transistor type of memory is preferably made of STN, but may be made of PZT or SBT. The memory of the single transistor type can be adopted in such a manner that the gate electrode is formed to include the first and the second ferroelectric memory and an electrode is placed between the first and the second ferroelectric layer so that voltages applied to the ferroelectric layers can be controlled independently of each other.

BRIEF DESCRIPTION OF THE DRAWINGS

FIG. 1 is an equivalent circuit diagram of a non-volatile memory according to the invention.

FIG. 2 is a view showing an non-volatile memory according to an embodiment of the invention.

[FIG. 3] FIG. 3 is a view showing the hysteresis characteristic of a non-volatile memory according an embodiment of the invention.

[FIG. 4] FIG. 4 is a time chart of the read in the non-volatile memory according to an embodiment of the invention.

[FIG. 5] FIG. 5 is a table showing the result of read of the non-volatile memory according to an embodiment of the invention.

FIG. 6 is an equivalent circuit diagram of a non-volatile memory according to a prior art.

FIG. 7 is a view showing the structure of a ferroelectric memory according to a prior art.

FIG. 8 is an equivalent circuit diagram of a ferroelectric memory according to a prior art.

FIG. 9 is a view showing the structure of a ferroelectric memory according to a prior art.

FIG. 10 is a view for explaining the operation of a ferroelectric memory according to a prior art.

DESCRIPTION OF THE PREFERRED EMBODIMENTS

Figure 1:
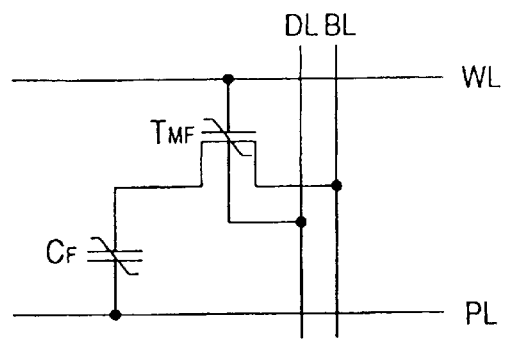
[FIG. 1]

An explanation will be given of an ferroelectric memory according to an embodiment of the invention in which PZT is used as a dielectric film. The ferroelectric memory, as seen from an equivalent circuit diagram of FIG. 1, constitutes a single cell consisting of an MFMIS transistor $T_{MF}$ with a gate electrode of a ferroelectric layer and a ferroelectric capacitor $C_F$ having a first electrode connected to one of the source/drain regions of the MFMIS transistor $T_{MF}$ and sandwiching another ferroelectric layer between the first electrode and a second electrode.

Figure 2A:
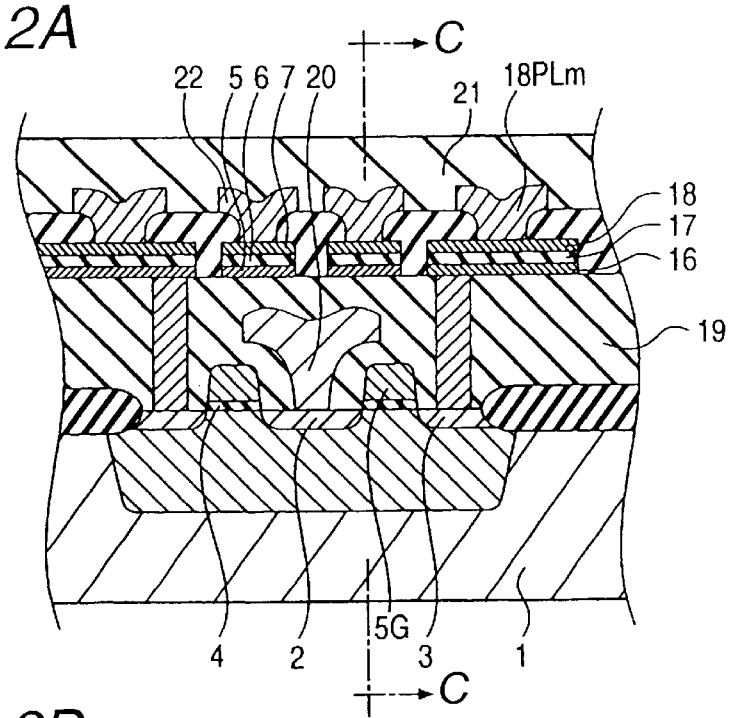
[FIG. 2]
Figure 2B:
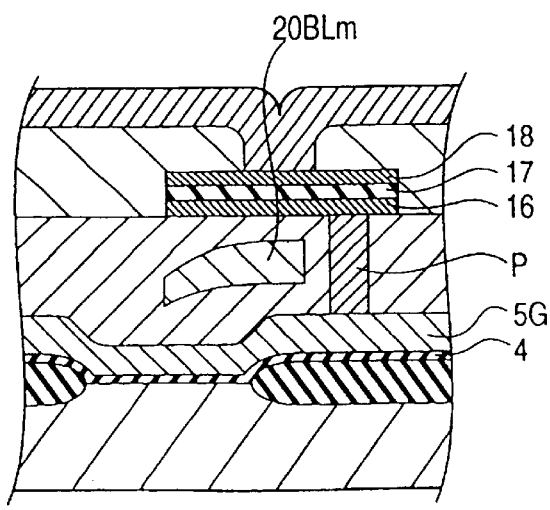
Figure 6:
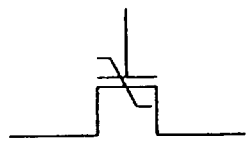
[FIG. 6]
Figures 7A, 7B, 7C:
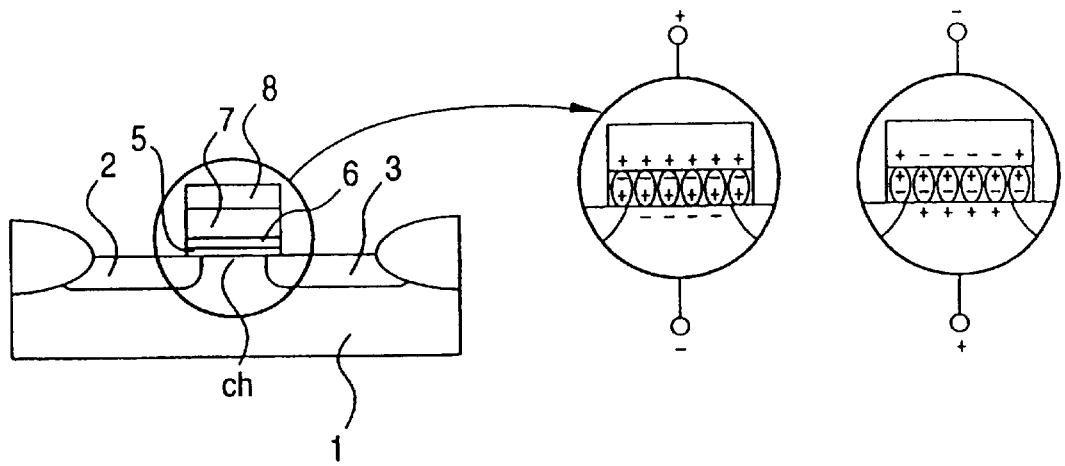
[FIG. 7]
Figure 8:
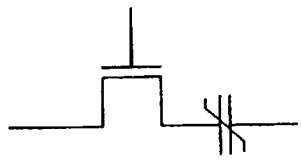
[FIG. 8]
Figure 9:
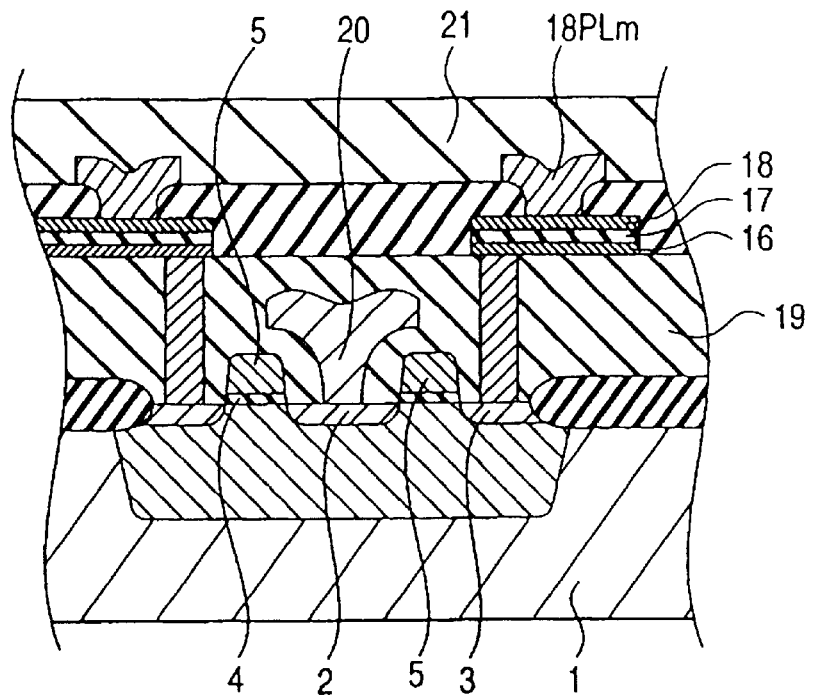
[FIG. 9]
Figure 10:
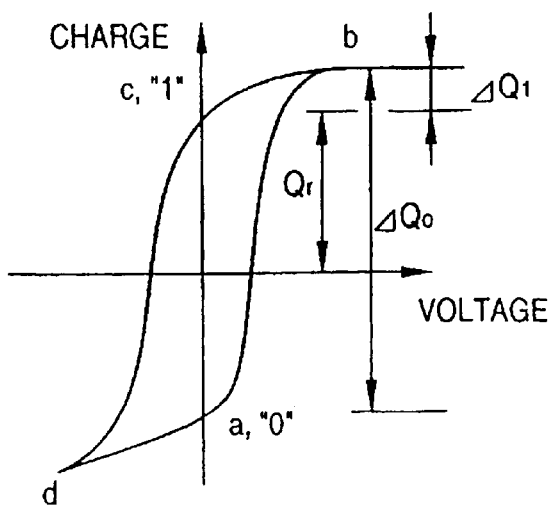
[FIG. 10]

FIGS. 2A and 2B are sectional structural views of a single cell of the ferroelectric memory according to this embodiment. FIG. 2B is a sectional view along line c—c of FIG. 2A. As seen from FIGS. 1A and 2B, the MFMIS transistor (FET) includes source/drain regions of p-type impurity regions formed on an n-type Si substrate 1, a base gate 5G formed on the surface of a channel region between the source/drain regions through a gate insulating film 4 which is a silicon oxide film having a thickness of 10 mn, a floating gate 5 having a two-layer structure through a plug P connected to the base gate 5G and composed of an iridium layer having a thickness of 100 nm and an iridium oxide layer having a thickness of 50 mn, a ferroelectric layer 6 of PZT having a thickness of 200 nm, and a control gate 7 of PZT having a thickness of 100 nm. These elements are successively stacked on the channel region. The ferroelectric capacitor includes a first electrode 16 having a two-layer structure composed of an iridium layer connected to one of the source/drain regions 2 and 3 and having a thickness of 100 nm, a ferroelectric layer 17 of PZT having a thickness of 200 nm and a second electrode 18 having a two-layer structure composed of an iridium layer having a thickness of 100 nm and an iridium oxide layer having a thickness of 50 nm.

The second electrode 18 is connected to a plate line $18PL_m$ and the one of the source/drain regions is connected to a bit line $20BL_m$.

The control gate 7 constitutes a word line and a drive line $D_{LN}22$ is connected to an N-well on the substrate surface at a position not shown so that it can control the potential of the substrate. The floating gate 5 is formed in the same level as the first electrode 16 of the ferroelectric capacitor so that it is connected to the base gate 5G through the plug P. Reference numerals 20 and 21 denote an insulating layer, respectively.

Now, the FET of the MFMIS structure and the ferroelectric capacitor can have two states (0) and (1), respectively, so that the total four combined states of (0, 0), (0, 1), (1, 0) and (1, 1) can be obtained.

Meanwhile, in the write of data, a gate voltage is applied to the control gate WL and the substrate DL. Since the threshold voltage of the transistor changes according to the polarized state of the ferroelectric layer, the value of the drain current (channel resistance) at a certain gate voltage is used as storage information. The drain current can be stored in the ferroelectric capacitor. Therefore, the write and read of the storage information can be executed using the stored drain current. In this way, the write and read of two values for each of the FEMIS and the ferroelectric capacitor, total four values can executed.

An explanation will be given of the operation of the non-volatile memory according to this embodiment.

FIG. 3 is a graph showing the hysteresis characteristic.

FIG. 4 is a time chart of a read operation.

A voltage $V_{W1}$ is applied to a word line WL to turn on FET so that (1) is written in the FET. In this case, the drive line DL is left at the ground potential.

Subsequently, the plate line is made "H (high)" and the bit line is made the ground potential so that (0) is written in the ferroelectric capacitor. At this time, the value (1, 0) is written. Thereafter, a voltage $V_{W0}$ is applied to the word line WL and the drive line DL is made "H" so that "0" is written in the FET. At this time, the value (0, 0) is written.

On the other hand, the plate line is made the ground potential and the bit line is made "H" so that (1) can be written in the ferroelectric capacitor. At this time, the value (1, 1) is written. Thereafter, a voltage $V_{W0}$ is applied to the word line WL and the drive line DL is made "H" so that "0" is written in the FET. At this time, the value (0, 0) is written.

In the read of data, a read voltage $V_r$ is applied to the word line. In this case, if the FET is (1), it is on and if the FET is (0), it is off.

Then, the plate line is made "H". If the change in the potential in the bit line is zero, the FET is decided (0) (the case where the change in the potential in the bit line is not zero but small will be described later).

If the change in the potential of the bit line is large, the capacitor is decided (1) to read the value (1, 1).

If the change in the potential of the bit line is small, the capacitor is decided (0), thereby reading the value (1, 0).

Next, the word line is made $V_{W1}$ (FET is turned on).

If the change in the potential of the bit line is large, FET is decided (0) and the capacitor is decided (1), thereby reading the value (0, 0).

On the other hand, if the change in the potential of the bit line is small, FET is decided (1) or (0), and the capacitor is decided (0). Thus, only if the FET is (0) and the capacitor is (0), the value of (0, 0) is read.

In the rewrite of data, because of the destructive read, the write is executed after the read. In this case, as seen from 4B, the substrate potential DL is placed at the ground.

As seen from FIG. 4C, while the word line is at $V_{W0}$ and $V_{W1}$ the plate line PL is raised to $V_c$ for a predetermined time. At this time, according to the word line potential and the plate line potential, the drain current flows and the bit line potential lowers by a predetermined amount.

In this way, as shown in FIG. 5, the read of the signals of four patterns can be made.

In the embodiment described above, although the ferroelectric film was made of PZT, it may be made of any other material as needed.

The ferroelectric film of PZT formed in the same step was used for both the FET of the MFMIS structure and the ferroelectric capacitor. However, the other material may be used and ferroelectric films having different characteristics may be made.

As a second embodiment, single transistor type of memory cell is simple and effective. The non-volatile memory comprising: a ferroelectric transistor including a gate electrode stacked through a first ferroelectric layer on the surface of a semiconductor substrate between source/drain regions formed therein, wherein said gate electrode comprises a first and a second electrode and a second ferroelectric layer sandwiched between said first and said second electrode, voltages applied to said first and second electrode are controllable independently, a first potential difference is generated between said gate electrode and said semiconductor substrate to invert the polarization of the said first ferroelectric layer, and a second potential difference is generated between the first and the second electrode to invert the polarization of said second ferroelectric layer so that write and read of data of multilevel values are executed.

As described above, in accordance with the invention, there is provided an non-volatile memory which can easily execute the stable read of multilevel values.

What is claimed is:

1. A non-volatile memory comprising:
   a ferroelectric transistor including a gate electrode stacked through at least a first ferroelectric layer on a surface of a semiconductor substrate between source/drain regions formed therein; and
   a ferroelectric capacitor including a first electrode and a second electrode, and a second ferroelectric layer sandwiched between the first electrode and the second electrode, the first electrode being connected to one of the source/drain regions, wherein a first potential difference is generated between the gate electrode and the semiconductor substrate to invert a polarization of the first ferroelectric layer, and a second potential difference is generated between the first electrode and the second electrode to invert a polarization of the second ferroelectric layer so that write and read of data of multilevel values are executed.

2. The non-volatile memory according to claim 1, wherein the ferroelectric transistor is an MFIS structure with the gate electrode formed through the first ferroelectric layer and a gate insulating film on the surface of the semiconductor substrate between the source/drain regions formed therein.

3. The non-volatile memory according to claim 1, wherein the ferroelectric transistor is an MFIS structure having a floating gate, the first ferroelectric layer and a control gate stacked through a gate insulating film on the surface of the semiconductor substrate between the source/drain regions.

4. The non-volatile memory according to claim 3, wherein the first and the second ferroelectric layers are a single ferroelectric layer formed in a single processing step.

5. The non-volatile memory according to claim 4, wherein the first and the second ferroelectric layers are formed of one of PZT and ST.

6. The non-volatile memory according to claim 4, wherein the first electrode includes a two layer film of iridium and iridium oxide.

7. The non-volatile memory according to clam 4, wherein the second electrode includes a two layer film of iridium and iridium oxide.

8. A non-volatile memory comprising:
   a ferroelectric transistor including a gate electrode stacked through a first ferroelectric layer on a surface of a semiconductor substrate between source/drain regions formed therein,
   wherein the gate electrode comprises a first electrode and a second electrode, and a second ferroelectric layer sandwiched between the first electrode and the second electrode,
   wherein voltages applied to the first electrode and the second electrode are controllable independently,
   wherein a first potential difference is generated between the gate electrode and the semiconductor substrate to invert a polarization of the first ferroelectric layer, and
   wherein a second potential difference is generated between the first electrode and the second electrode to invert a polarization of the second ferroelectric layer so that write and read of data of multilevel values are executed.

9. The non-volatile memory according to claim 8, wherein the first and the second ferroelectric layers are formed of STN.

10. The non-volatile memory according to claim 8, wherein the first electrode includes a two layer film of iridium and iridium oxide.

11. The non-volatile memory according to claim 8, wherein the second electrode includes a two layer film of iridium and iridium oxide.

* * * * *